United States Patent
da Cruz et al.

(10) Patent No.: US 6,615,377 B1
(45) Date of Patent: Sep. 2, 2003

(54) INTEGRATED CIRCUIT WITH SIGNAL-VECTOR QUEUE FOR NORMAL AND TEST MODES OF OPERATION

(75) Inventors: Victor L. da Cruz, Rochester, NY (US); James R. McGee, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/566,367

(22) Filed: May 8, 2000

(51) Int. Cl.[7] .............................................. G01R 31/28
(52) U.S. Cl. ....................................................... 714/724
(58) Field of Search ................................ 714/724, 733, 714/734, 738, 742, 31, 32, 33, 37; 703/13, 14

(56) References Cited

U.S. PATENT DOCUMENTS

| | | | | |
|---|---|---|---|---|
| 5,617,431 A | * | 4/1997 | Tupuri et al. | 714/738 |
| 5,621,739 A | * | 4/1997 | Sine et al. | 714/724 |
| 5,878,051 A | * | 3/1999 | Sharma et al. | 714/724 |
| 6,266,793 B1 | * | 7/2001 | Mozdzen et al. | 714/727 |
| 6,286,121 B1 | * | 9/2001 | Osawa et al. | 714/738 |

* cited by examiner

Primary Examiner—Christine T. Tu (57) ABSTRACT

An integrated circuit with enhanced testability provides a normal-operation mode of operation with an observability function matching that used in a test-drive mode. Specifically, in both normal-operation mode and test-drive mode, captured signal vectors from captured-signal nodes are stored in a signal-vector queue. Thus, the local storage of signal vectors during test-drive mode does not represent a deviation from normal operation that could otherwise impair test validity. Moreover, since captured-signal vectors are stored during normal-operation mode, they are available for readout when normal operation is halted. These captured-normal-signal vectors reflect normal operation without any distortion due to testing—so data validity is optimal. Drive-signal vectors can be stored in the queue, which can be a dual-ported RAM, during a test-setup mode, and readout to driven-signal nodes in test-drive mode. Compression can be implemented by not incrementing the queue write pointer when a signal matches its immediate predecessor. Timing information can be preserved in this compression scheme by storing a repetition count with each signal vector.

14 Claims, 5 Drawing Sheets

INTEGRATED CIRCUIT WITH SIGNAL-VECTOR QUEUE FOR NORMAL AND TEST MODES OF OPERATION

BACKGROUND OF THE INVENTION

The present invention relates to integrated circuits and, more particularly, to integrated circuits with built-in test circuitry. A major objective of the present invention is to provide enhanced validity for integrated-circuit testing.

Much of modern progress is associated with the proliferation of computer technology, which has been made possible by advances in integrated-circuit manufacturing technology. These advances have allowed smaller circuit elements. The decreasing circuit-element dimensions have allowed greater speeds (as signals have shorter distances to travel) and greater functionality (as more circuit elements are provided per integrated circuit).

Each of these advances presents a challenge. The smaller circuit elements are more vulnerable to manufacturing defects. The higher speeds require stricter timing tolerances. Greater functionality requires greater complexity, resulting in greater susceptibility to logic-design errors. Accordingly, verification of correct operation has become increasingly important.

Verification of the correct operation of integrated circuits and incorporating systems is required at many stages of development. During the design and prototype stages, verification of the correct functional operation first of system components and then of the entire system is required. During the prototype stage, verification of the correct operation within and beyond the operating region of clock frequencies, power supply voltages, and ambient temperature is required. During the production stage, verification of the correct operation of system components and the entire system to screen for manufacturing defects is required.

Testing typically involves controlling selected integrated-circuit nodes to implement test conditions and observing selected integrated-circuit nodes to determine the test results. An integrated circuit can be tested under normal conditions and during normal operation by applying test signals to its external inputs and reading the results from its external outputs. However, thoroughly testing a complex integrated circuit in this way can be unacceptably difficult and time consuming. For example, a complex series of inputs may be required to force an internal node to a desired test condition, and verification that the desired test condition has been achieved may not be feasible. Controllability and observability of internal nodes become more difficult with increasing functional distance from the external input/output ports of the integrated circuit.

Many integrated circuits provided multiplexed access to internal nodes. For example, external testing equipment can access internal nodes via a serial scan chain. Controlling and observing internal nodes using serial scan chains is generally much faster and more direct than controlling them through the normal functional blocks.

However, providing external test equipment with multiplexed access to internal nodes implies a dedicated test mode of operation that raises a concern of the validity of test data. Scanning data in and out of the integrated circuit using scan chains is typically much slower than data transfers during normal operation. In addition, the testing equipment adds loading to the monitored signals; this loading affects the operation of the electronic system being monitored. Moreover, external hardware can inject noise into the system, which can disturb system operation. To the extent test conditions fail to match normal conditions, test validity is compromised.

The problems with loading and noise can be reduced when testing is performed using onboard self-test hardware. However, the capabilities of dedicated self-test hardware are typically limited to conserve integrated circuit area and routing resources for normal functions.

The competition for circuit area and routing resources is less of a concern where testing is performed by a test program run on an onboard processor. However, the test program approach is limited to integrated circuits with suitable processors built in. In any event, a test program is often functionally distant from nodes that it needs to control and observe so that abnormally slow data rates are required for controllability and observability.

While considerable effort has been expended to make test conditions as much like normal conditions as possible, test validity is becoming more challenging. In the increasingly quantum-mechanical realm of state-of-the-art integrated-circuit devices, test validity is an inherent problem: it is a principle of quantum mechanics that the act of observing the operation of a system affects its operation.

What is needed is an approach to testability that optimizes the validity of test results. In other words, the test results should reliably indicate whether not a system would operate as intended during normal, non-test, operation. Another objective is to make high-speed monitoring possible

SUMMARY OF THE INVENTION

The present invention inverts the conventional approach to improving test validity. The conventional approach is to make test conditions more like normal operation. The present invention improves test validity by making normal operation more like test conditions. While many would balk at potentially compromising normal operation for test purposes, some surprising advantages of the invention make such a "compromise" worthwhile.

The present invention provides for repeatedly sampling ("capturing") selected signals and storing the results in a queue memory. Successive samples are stored respectively at successive queue locations so that the queue represents a "history" of the captured signals over time. The queue can operate as a circular buffer so that, once the queue is full, new samples are written over the oldest stored samples. The circular buffer can be implemented in random-access-memory (RAM), with a write pointer indicating the queue location to be written to next.

The sample values for the selected signals acquired at any given time constitute a "captured-signal vector". Upon capture, each signal vector is stored at a respective queue location, e.g., the one pointed to by a write pointer. So that the stored signal vector is not overwritten by its immediate successor, the write pointer can be advanced as each signal vector is stored.

If the selected signals do not change from sample to sample, the queue could soon be filled with many identical vectors. The invention provides for data compression in such cases. For example, advancement of the write pointer can be inhibited when a vector matches its immediate predecessor. So that timing information is not lost, a count of the number of sample cycles over which a vector remained unchanged can be indicated by a count stored with the vector.

A more sophisticated variant of this compression scheme allows some of the selected signals to be "masked" during the comparison of successive vectors so that a vector is overwritten by its predecessor even when the values of masked signals change from vector to vector. While masking results in some loss of information, the generally great improvement in compression allows correspondingly longer histories to be represented in the queue.

The queue can be used, not only for storing captured-signal vectors, but also for storing drive-signal vectors. Preferably, the queue can transmit drive-signal vectors and store captured-signal vectors concurrently. To this end, the queue can be a dual-ported RAM with separately addressable read and write functions. If race conditions are not a concern, a single read/write pointer can be used. If race conditions are a concern, the current read and write locations can be forced to be different-either with a single pointer with an offset between read and write locations, or using restrictions on the pointers to ensure they do not point to the same location.

In a test-setup mode, a tester, e.g, external test equipment and/or a test program, can write drive-signal vectors to the queue via a test port. Then, in test-drive mode, the test-drive-signal vectors are sequentially transmitted to selected driven-signal nodes. During test-drive mode, captured-signal vectors are stored in the queue. Finally, in a test-readout mode, the contents of the queue can be read via the test port.

During test-setup mode and test-readout mode, data can be transferred between the queue and the tester via a test port. The data transfer rate can be dropped as necessary to accommodate the tester's capabilities and the available bandwidth between the queue and the tester. While the speeds and other conditions during test-setup mode and test-readout mode can be very different from normal operation, test results are not determined during these modes.

Tests results are determined during test-drive mode. In test-drive mode, the observability function, i.e., the storing of captured-signal vectors, is the same as it is for normal operation. Thus, a major advantage of the present invention is that, insofar as the observability function is concerned, testing does not deviate from normal operation. Test validity is correspondingly enhanced.

A surprising additional advantage is that useful test data can be obtained without the controllability function causing a deviation from normal operation. Normal operation can be halted at any time so that the queue contents can be read (in test-readout mode). The data so read is collected during normal operation, without any distortion due to testing. The data represents a recent history of normal operation that can be analyzed to characterize system performance. This system-history analysis has enhanced validity because the underlying data does not reflect any deviations form normal operation. These and additional features and advantages of the invention are apparent from the detailed description below with reference to the following drawings.

BRIEF DESCRIPTION OF THE DRAWINGS

In FIG. 1, two-letter referents indicate operation modes: "NO" is normal-operation mode, "TD" is test-drive mode, "TR" is test-readout mode, and "TS" is test-setup mode. The locations of these referents in FIG. 1 indicate the active multiplexer input and the active switch output for these modes.

DESCRIPTION OF THE PREFERRED EMBODIMENTS

Figure 1:
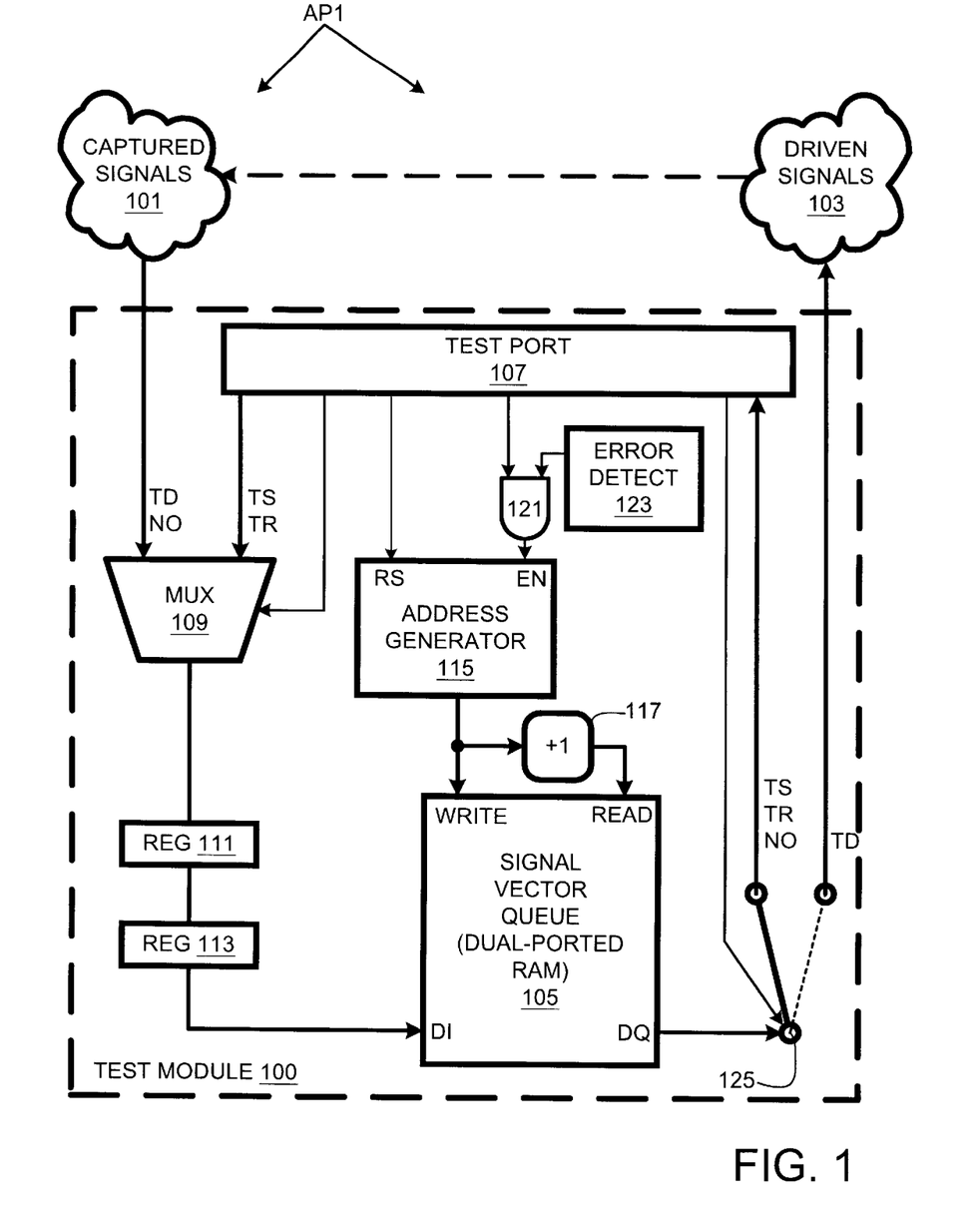
FIG. 1 is a schematic illustration of a first integrated circuit embodying the present invention.

In accordance with the present invention, an integrated circuit AP1 includes a test module 100, as shown in FIG. 1, in which the observability function is performed the same in normal-operation mode NO as it is in test-drive TD mode. Test module 100 is coupled to selected captured-signal nodes 101 of the rest of integrated circuit AP1 for receiving "captured" signals therefrom. Test module 100 is also coupled to selected driven-signal nodes 103 for providing "drive" signals thereto. Captured-signal nodes 101 are coupled to driven-signal nodes 103, either directly (for continuity testing) or via functional blocks (for function testing).

Test module 100 includes a signal-vector queue 105 for storing captured-signal vectors and drive-signal vectors. A test port 107 determines whether captured-signal vectors or drive-signal vectors are stored by controlling a multiplexer 109. Test port 107 provides for interfacing with external test equipment and with a test program run on integrated circuit AP1.

One signal input of multiplexer 109 is coupled to captured-signal nodes 101, while the other is coupled to test port 107 for receiving drive-signal vectors therefrom. The output of multiplexer 109 is provided to queue 105 via a pair of registers 111 and 113, which respond, respectively to rising and falling edges of the system clock to ensure vectors are not in transition as they are stored.

Queue 105 has 1024 storage locations of sixty-four bits each. Thus, the value of up to sixty-four captured signals can be stored as a vector in each storage location. 1024 vectors can be stored at any given time, so that a 1024-cycle history of integrated circuit AP1 is available.

Each signal vector is stored at the queue location indicated by address generator 115. In normal-operation and test-drive modes, address generator 115 increments one address each system clock cycle. Queue 105 serves as a circular buffer in that, address 0 is the successor to the maximum address.

Address generator 115 is coupled to the write-address port of queue 105 directly and to the read address port of queue 105 via modulo 1024 address incrementer 117. This causes the read address to be one greater than the write address. This ensures that, in test-drive mode, a queue location is read before it is written over. In addition, race conditions are avoided since the read and write addresses cannot be the same.

Test port 107 provides reset and enable control signals to address generator 115. The enable control signal from test port 107 is ANDed by an AND gate 121 with an active-low error detection signal from error detection logic 123. In normal and test-drive modes, reset is off and enable is on. Enable is inactivated and reset is pulsed to initiate test-setup TS mode. Enable can then be reactivated to load in drive-signal vectors from location 0 up to location 1023.

Test-drive mode differs from normal-operation in the setting of a switch 125 coupled to the data output DQ of queue 105. Switch 125 is controlled via test port 107. In normal-operation, switch 125 couples queue output DQ to test port 107. In normal-operation, the vectors read from queue 105 are entered into a register of test port 107. Successive vectors simply overwrite each other. There is insufficient bandwidth to readout these vectors continuously to a circuit tester. However, single vectors can be readout on a "snapshot" basis to complement other testing modes.

In test-setup mode, test port 107 causes switch 125 to couple queue output DQ to driven-signal nodes 103 in preparation for test-drive mode. In test-drive mode, address generator 115 is enabled for up to 1023 clock cycles. (The drive-signal vector stored at location 0 is not used). The drive signals are processed by integrated circuit AP1 (exclusive of test module 100), and their effects are reflected in captured-signal values fed back to data input DI of queue 105. Each captured-test-signal vector overwrites the drive-signal vector asserted in the previous clock cycle. At the end of the test-drive mode, at least some drive-signal vectors have been overwritten by captured-test-signal vectors so that queue 105 stores a history of test-drive results.

In a test-readout (TR) mode, address generator 115 is reset and switch 125 couples queue output DQ to test port 107. Address generator 115 is then enabled, and the captured-test-signal vectors are read out of queue 105 via test port 107 by a test program or external test equipment.

Test-setup mode and test-readout mode both require access to test port 107 by external test equipment or a test program, and thus differ substantially from normal-operation. However, test data is not determined during these modes, but rather only during test-drive mode. Operation of test module 100 is essentially similar in test-drive mode and normal-operation, with the exception of the position of switch 125. Insofar as the observability function is concerned, there are no differences between the captured-normal-signal vectors acquired during normal-operation and the captured-test-signal-vectors acquired during test-drive mode.

The signal-vectors captured during normal mode are not used in normal mode (except, as indicated above, on a snap-shot basis). However, normal operation can be halted at any time, and queue 105 will contain a recent history of integrated circuit operation. In particularly, if error-detection logic 123 detects an error, address generator 115 stops incrementing. The most recently captured signal vectors remain stored in queue 105. Test-readout mode can be implemented to access the captured normal-signal vectors for analysis of the conditions that lead up to the error. Because the queue contents are determined during normal mode, there are no validity issues regarding either observability or controllability. Thus, the invention provides for complete data validity during normal mode and enhanced data validity in test-drive mode.

Figure 2:
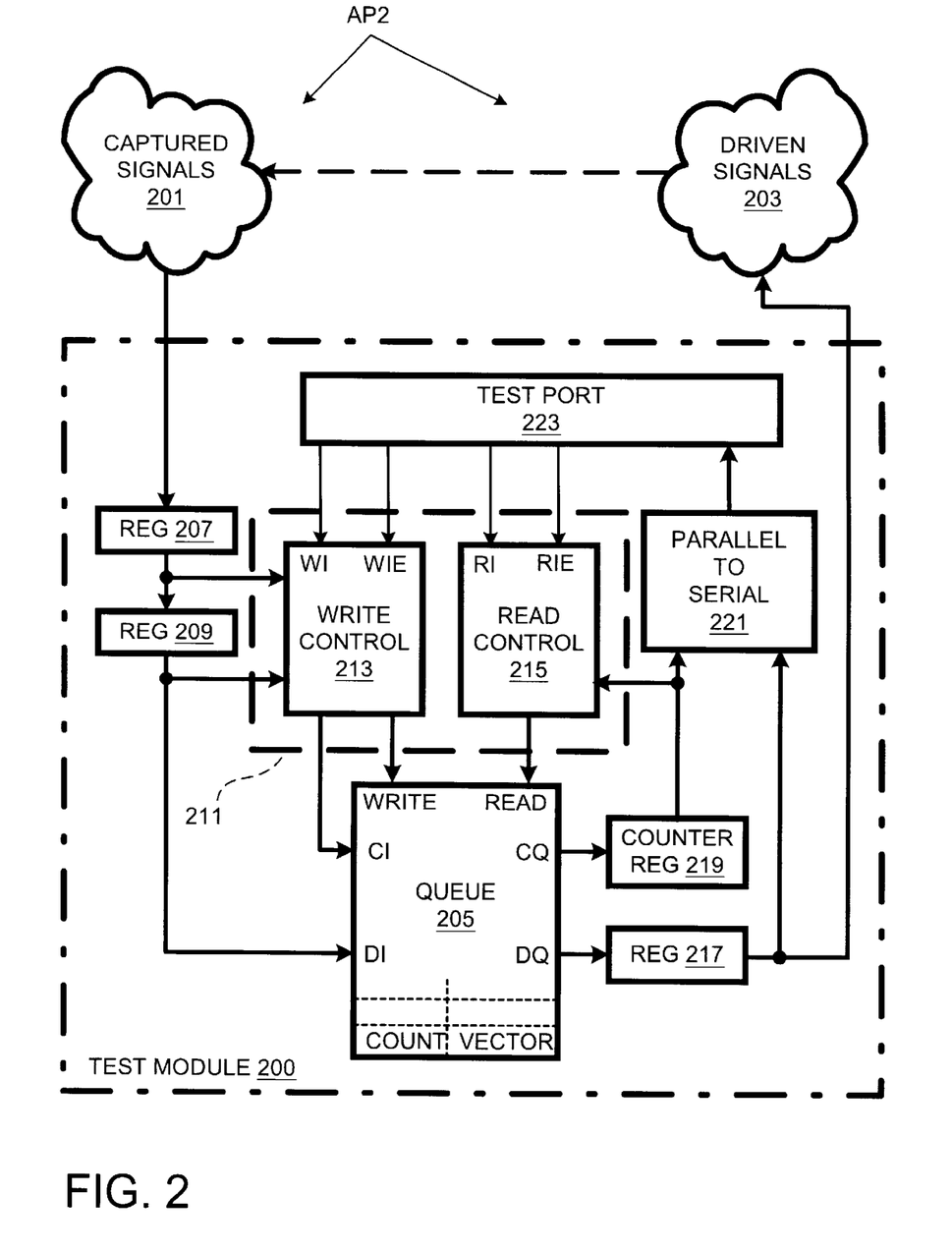
FIG. 2 is a schematic illustration of a second integrated circuit embodying the present invention.

A second integrated circuit AP2 includes a test module 200, as shown in FIG. 2. Test module 200 offers a number of refinements over test module 100. The most salient of these refinements is the use of compression, which allows a much longer signal history to be acquired for a given queue capacity.

Test module 200 is coupled to captured-signal nodes 201 and driven-signal nodes 203. Captured-signal vectors are provided to data input DI of signal-vector queue 205 via registers 207 and 209. Signal vectors are written to addresses determined by an address generator 211. Address generator 211 includes a write controller 213 and a read controller 215, which operate independently. In alternative embodiments, operation of a read controller and a write controller are coordinated to the extent required to avoid unintended overwrites of drive-signal vectors.

The outputs of registers 207 and 209 are provided to write controller 213 to effect the compression scheme detailed below with reference to FIG. 3. This compression scheme results in repetition counts being stored in association with signal vectors. To this end, write controller 213 is coupled to a count input CI of queue 205 for providing the repetition counts. Queue 205 has 1024 sixty-four bit storage locations. Each storage location stores fifty-six signal values and an eight-bit repetition count.

The drive-signal data format is the same as the captured-signal data format. Each drive-signal vector is associated with a repetition count. In the case of a drive-signal vector, the repetition count indicates the number of cycles a drive-signal vector is to be asserted. When a queue location indicated by read controller 215 is read, the signal vector stored there is provided from queue data output DQ to a readout register 217. The associated repetition count is provided from count output CQ to a counter register 219.

In test-drive mode, the repetition count is provided by counter register 219 to read controller 215, which holds the current value as the it counts the number of cycles indicated by the repetition count. When the repetition count is reached, read controller 215 increments the read address. During the counting, the drive signals in readout register 217 are provided to driven-signal nodes 203. (May want to cycle through drive vectors).

During test-drive mode, captured-signal vectors and associated repetition counts written to queue 205. During test-readout mode, these vectors and counts are provided to parallel-to-serial converter 221 for external access at serial test port 223.

Captured-signal nodes 201 and driven-signal nodes 203 are coupled to "normal" signal sources during normal operation through multiplexers. During test-setup mode, captured-signal nodes 201 are coupled to test port 223 so that drive-signal vectors can be written to queue 205. During test-drive mode, driven-signal nodes are coupled to register 217 instead of normal-signal sources to implement the controllability function. In an alternative embodiments, the queue or a register coupled to its input is part of a serial scan chain that provides a path from the test port to store drive vectors in the queue.

Test port 223 is coupled to address controller 211 so that the circuit tester can control reading and writing to queue 205. Test port 223 controls a write-increment input WI of write controller 213 so the write increments can be controlled directly by the circuit tester during test-setup. Test port 223 controls a write-increment-enable WIE input of write controller 213 to determine when write-controller 213 increments according to its internal logic. Likewise, test port 223 controls a read-increment input RI read controller 215 to that a circuit tester can control incrementing of the read address. Test port 223 also controls a read-increment-enable input RIE of read controller 215 to determine when read controller 215 increments according to its internal logic.

Figure 3:
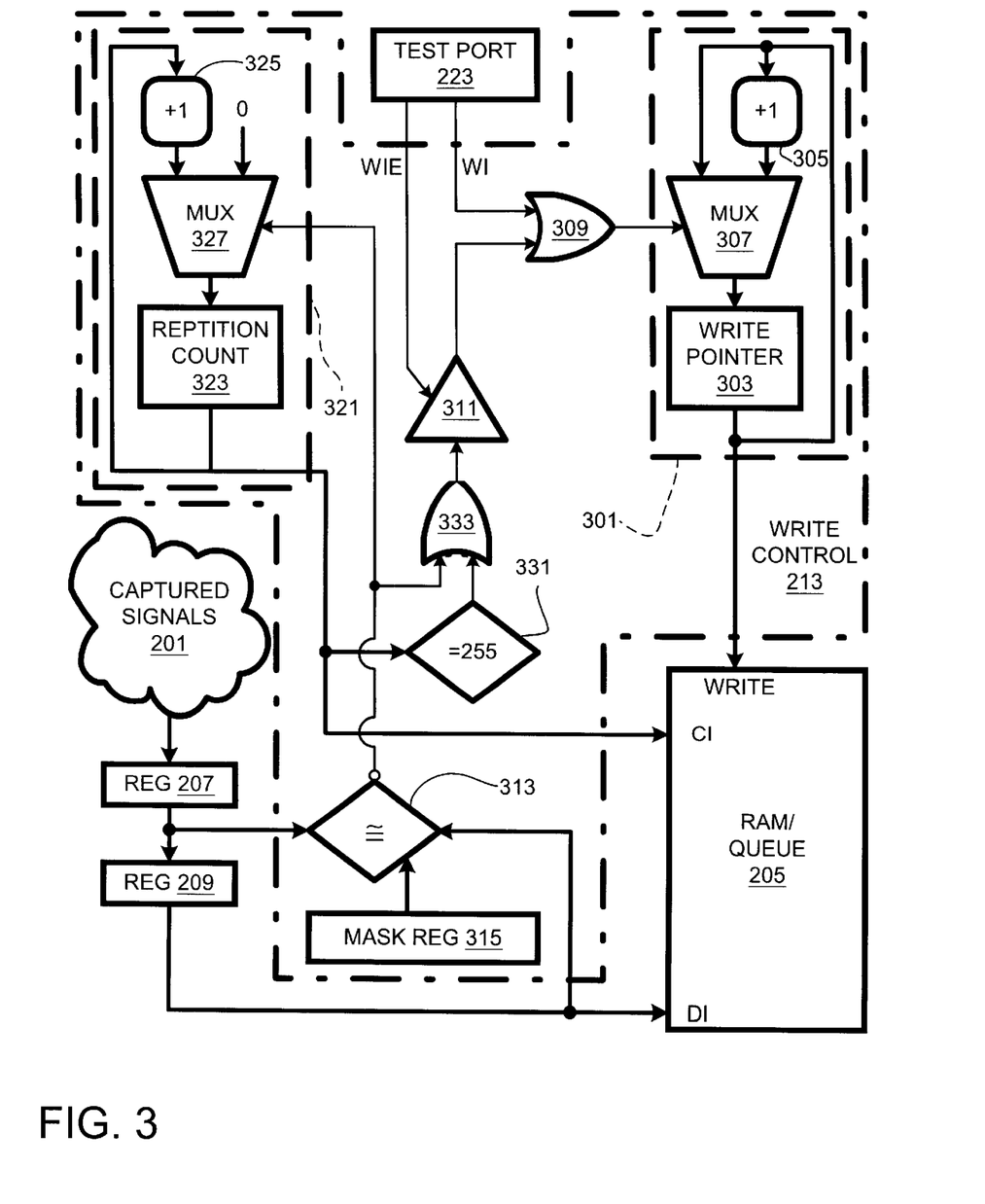
FIG. 3 is a schematic illustration of a write controller of the integrated circuit of FIG. 2.

Write controller 213 is shown in greater detail in FIG. 3. The selected write address is determined by a write counter 301, which includes a write-pointer register 303, an incrementer 305, and a multiplexer 307. The control input to multiplexer 307 serves as the counter enable signal: when this control input is high, the register output is fed back to incrementer 305, which provides the register input for the next clock cycle via multiplexer 307. When the control input to multiplexer 307 is low, the write-pointer register output is fed back unchanged via multiplexer 307 so that the write address remains constant.

The control input of multiplexer 307 is fed by the output of an OR gate 309, one input of which is the write-increment input WI fro write controller 213, and the other input of which is provided by a gated buffer 311, which is logically equivalent to an AND gate. The control input to gated buffer 311 is the write-increment-enable input WIE for write controller 213. This input is coupled to test port 223. Thus, a circuit tester can determine, via test port 223, whether the tester controls the write address or whether the write address is controlled internally by write controller 213. Buffer 311 is enabled in normal-operation mode and in test-drive mode, and disabled in test-setup mode and test-readout mode. In test-setup mode, the write increment input WI is pulsed to increment the write address after a drive-signal vector is written to queue 205.

In normal-operation mode and in test-drive mode, the compression scheme determines when write-pointer counter 301 increments. The compression scheme inhibits the write address from incrementing (at least most of the time) when two successive captured-signal vectors match. The compression scheme increments the write pointer when successive vectors do not match or when the number of matches reaches a maximum count.

A comparison function 313 determines when two successive signal vectors match. Comparison function 313 is responsive to a mask register 315 that allows some signals (vector dimensions) to be ignored for comparison purposes. Two successive signal vectors match ("≅") if they are the same or if they differ only in masked dimensions. (As with logic gates, the circle at the output of comparison function 313 indicates its output is low when a match is indicated and high when a mismatch is indicated.)

The output of comparison function 313 controls a reset input of a repetition counter 321. Repetition counter 321 comprises an eight-bit repetition-count register 323, an incrementer 325, and a multiplexer 327. The output of repetition-count register 323 is fed back to incrementer 325, which provides one input to multiplexer 327. The other multiplexer input is hard-wired to zero so that the control input of multiplexer 327 is the reset input for counter 321.

Counter 321 is enabled while comparison function 313 indicates a match. While enabled, counter 321 indicates the number of times, modulo 255, a signal vector is repeated and overwritten. A comparison function 331, coupled to the output of eight-bit repetition count register, indicates when the maximum count is reached. When the maximum count of 255 is reached, comparison function 331 provides a logic-high output to a first input of an OR gate 333, causing it to go high.

The output of OR gate 333 also goes high whenever comparison function 313 indicates a mismatch. To this end, a second input of OR gate 333 is coupled to the output of comparison function 313. Thus, OR gate 333 goes high whenever comparison function 313 indicates a mismatch or whenever the repetition count reaches 255. While the repetition count is below 255 during indication of a match by comparison function 313, the output of OR gate 333 is low.

The output of OR gate 333 is the signal input to buffer 311. Thus, the output of OR gate 333 determines whether or not write-pointer counter increments during normal-operation mode and during test-drive mode. In these modes, the write pointer increments when successive captured signal vectors do not match; also, the write pointer increments whenever the number of matches since the last increment reaches the maximum count of 255. Otherwise, the write pointer does not increment while matches are detected so captured-signal vectors overwrite their matched predecessors.

Figure 4:
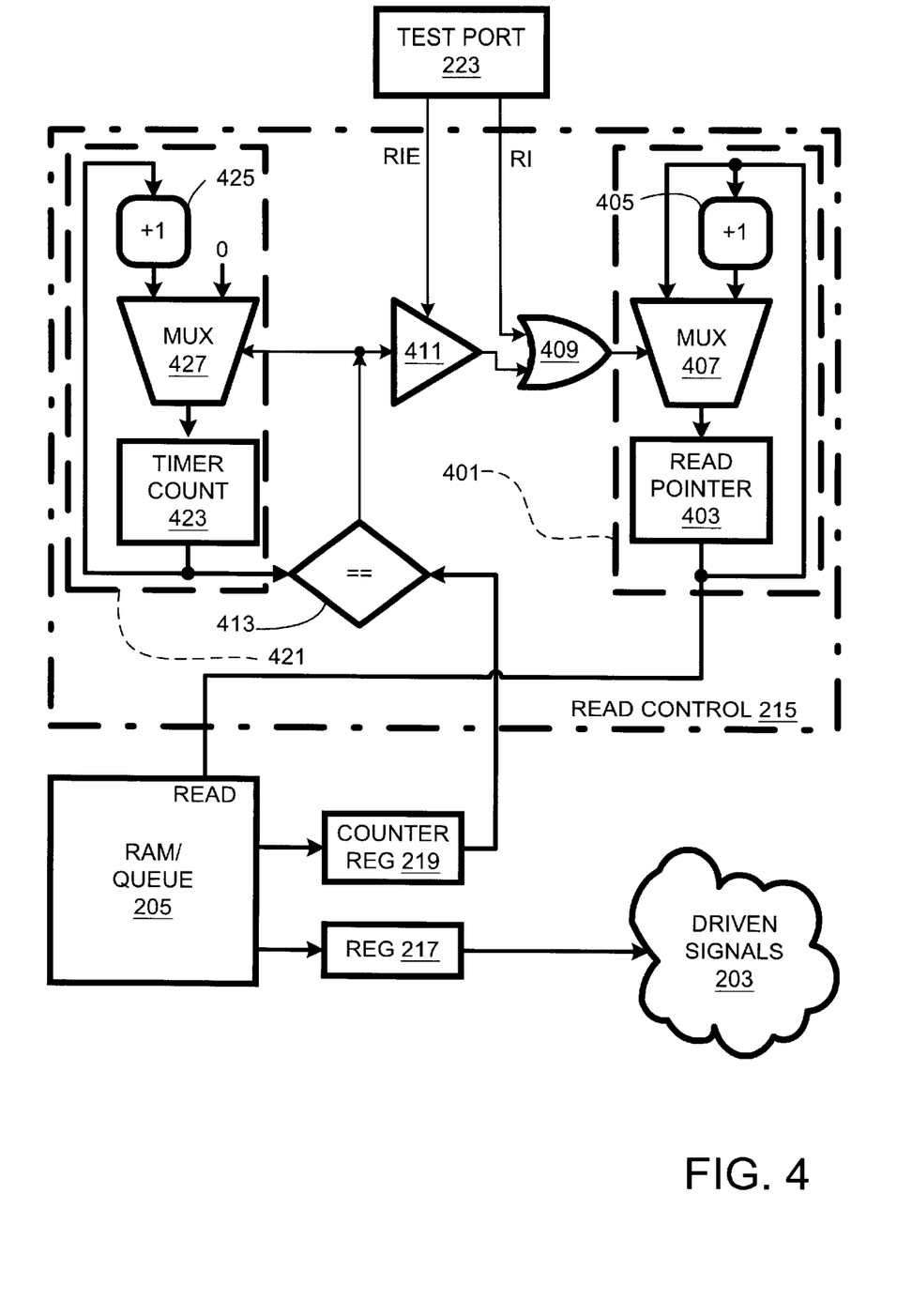
FIG. 4 is a schematic illustration of a read controller of the integrated circuit of FIG. 2.

Read controller 215, shown in greater detail in FIG. 4, includes a read counter 401 that stores a read pointer for queue 205. Read counter 401 comprises a read-pointer register 403, an incrementer 405, and a multiplexer 407. The read pointer stored in register 403 is fed back to register 403 either directly or though incrementer 405, depending on the control input of multiplexer 407. The control input of multiplexer 407 thus serves as an enable input to read-pointer counter 401.

An OR gate 409 drives the control input to multiplexer 407. A first input, coupled to a buffer 411, to OR gate 409 is active during normal-operation mode and during test-drive mode. A second input to OR gate 409, coupled directly to test port 223, is active during test-readout mode. Typically, neither input is active during test-setup mode.

During test-readout mode, test port 223 holds the read-increment-enable RIE input of read control 215 low. This input gates buffer 411 so that it is disabled during test-readout mode. During this mode, test port 223 can pulse the read increment input RI to OR gate 409 so that the read pointer can increment at a rate appropriate for reading out queue 205 via test port 223.

During normal-operation mode and test-drive mode, test port 223 activates the read-increment-enable input RIE and maintains the read-increment input IE low. In these modes, the input to buffer 411 determines when the read pointer increments. This input is determined by the output of a comparison function 413.

Comparison function 413 compares the count in counter register 219 with the current count of a timer counter 421. Timer counter 421 comprises a timer-count register 423, an incrementer 425, and a multiplexer 427. The output of timer-count register 423 is fed back via incrementer 425 when comparison function 413 indicates a non-match.

When the value stored in counter register 219 is zero, a match is indicated immediately. Otherwise, timer counter 421 increments until its value matches the value stored in counter register 219. When a match is indicated, multiplexer 427 selects zero to be stored in timer register 423, effectively resetting timer counter 421. Also, the input to buffer 411 goes high for one cycle so the read address is incremented once. This causes a new signal vector to be output, and the associated count replaces the previous count in counter register 219.

Thus, during normal-operation and test-drive modes, the signal vector stored in queue indicated by the read pointer is asserted for the number of cycles indicated by the associated repetition count stored with that signal vector. This decompression scheme allows a test to be run for a number of cycles far exceeding the number of storage locations in queue 205. The difference here between normal-operation mode and test-drive mode is that multiplexers in driven-signal nodes 203 block drive-signal vectors in normal-operation mode and transmit them in test-drive mode. Otherwise, these modes are very similar.

In test-readout mode, the read-increment-enable input RIE is held inactive, and readout is controlled using read-increment input RI. In test-setup mode, both control inputs to read control 215 are usually held low. Optionally, the read-increment input RI can be pulsed so that test-drive vectors can be confirmed as they are written to queue 205.

Integrated circuit AP2 also provides for a "drive-only" mode of operation. This is a variant of test-drive mode in which test port 223 holds both the write increment input WI and the write-increment-enable input WIE of write control 213 inactive. This prevents drive-signal vectors from being overwritten. A first integrated circuit in drive-only mode can be used to provide test vectors to a second integrated circuit. The second integrated circuit would be in a complementary "capture-only" mode which is similar to test-drive mode except that the drive-signal vectors are provided by the first integrated circuit instead of the local signal-vector queue. Since the drive-signals vectors are not overwritten, the sequence of drive-signal vectors can be iterated as many times as required.

Figure 5:
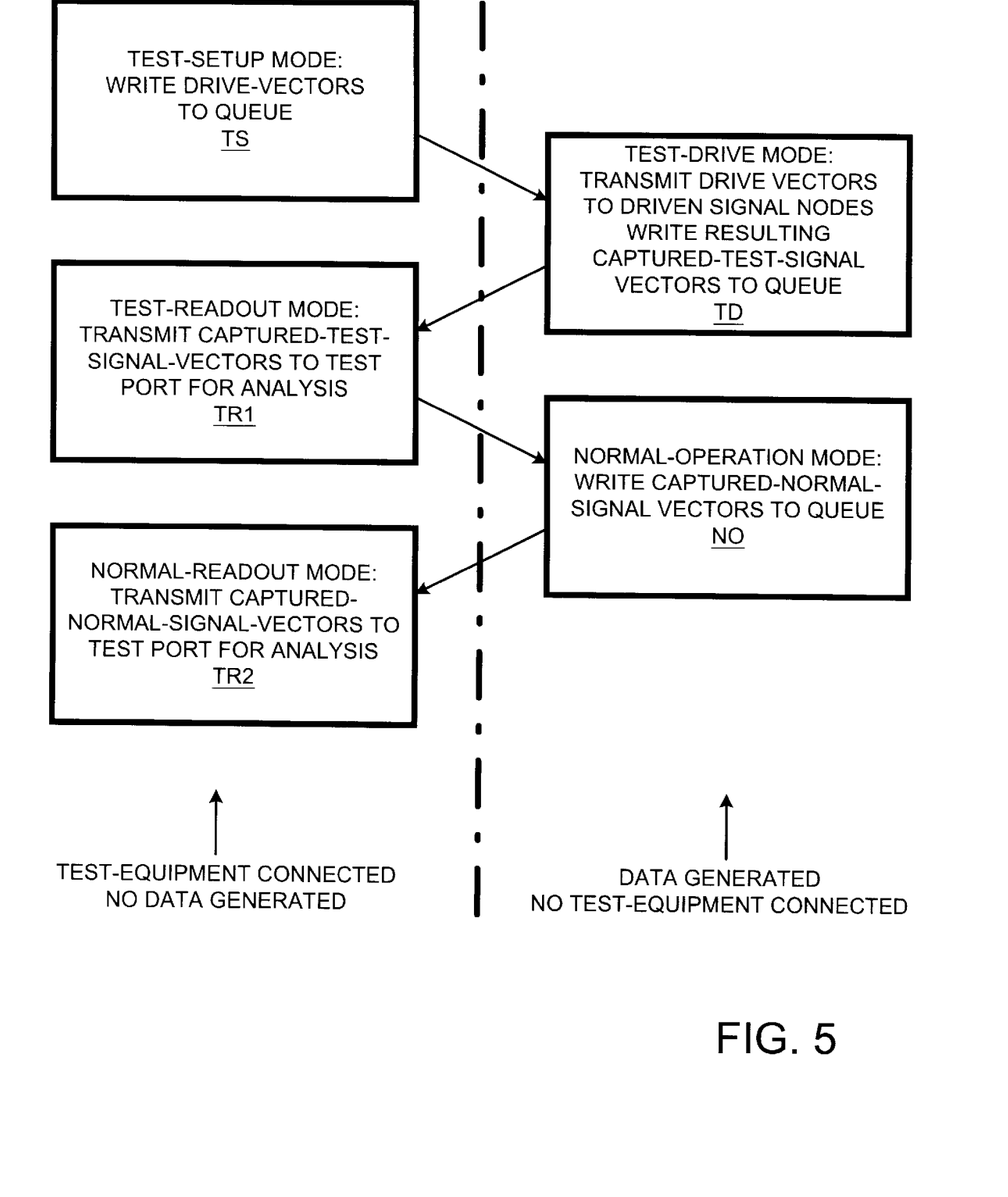
FIG. 5 is a flow-chart of a method in accordance with the invention practiced in the contexts of the integrated circuits of FIGS. 1 and 2.

A method M1 as practiced in the contexts of integrated circuits AP1 and AP2 is flow-charted in FIG. 5. In test-setup mode TS, drive-signal vectors from external test equipment or a test program are written to a signal vector queue. In test-drive mode TD, drive-signal vectors are read from the queue and provided to driven-signal nodes. The values of the resulting drive signals affect the values of other signals selected for capture. The drive-signal vectors thus result in captured-test-signal vectors, which are written into the queue. Depending on the addressing scheme, the captured-test-signal vectors can overwrite previously read drive-signal vectors. In a first instance TR1 of test-readout mode, captured-test-signal vectors are read from the queue to a test port for access by external test equipment or a test program.

Assuming that the test results in a favorable rating for the integrated circuit, normal-operation mode NO is employed. In this mode, the integrated circuit basically does what it was designed to do other than test itself. During normal-operation mode NO, normal signals are captured from the same captured-signal nodes that were the source of the captured-test-signal vectors. In this case, the captured-normal signals are arranged as captured-normal-signal vectors, which are written to the queue.

Normal-operation mode can be halted by the tester, e.g., by inactivating a write-increment-enable input. Alternatively, an error detection signal can halt normal operation automatically, as described in relation to integrated circuit AP1. In either case, the queue contains a sequence of captured-normal-signal vectors that collectively describe the recent history of the integrated circuit. In accordance with a special feature of method M1, the captured-normal-signal vectors can be accessed by the tester in a second instance TR2 of test-readout mode. Modes of operation, drive only, capture only, monitor-snapshot.

Test-setup mode TS and test-readout mode TR assume that a test program is running or external test equipment is connected. Data is not generated in these three modes. Data is generated during normal-operation mode NO and test-drive mode TD, the two modes that do not require a test program to be running or external test equipment to be connected. Method M1 provides for data generation under conditions (test-drive mode TD) that closely match normal operation, and for data generation under conditions (normal-operation) that do not differ at all from normal operation. Hence, the invention provides for highly valid analytical data regarding an integrated circuit.

If, as in integrated circuit AP1 and AP2, the same queue is used for drive-signal vectors and for captured-signal vectors, there is an issue of a captured-signal vector overwriting a drive-signal vector before the latter has served its purpose. In integrated circuit AP1, this issue is addressed by forcing the read address to be different from the write address. Integrated circuit AP2 has no such provision, so care must be taken in selecting the drive-signal vectors.

In a modification of integrated circuit AP2, a comparison function indicates an error when the read and write pointers are equal. In an alternative embodiment, there is a flexible interlock that prevents the pointers from overtaking each other. Reserve count. Alternatively, different areas of the queue memory can be used for drive-signal vectors and for captured-signal vectors. Either two separate queues can be used, or a single queue memory can be segmented. In fact, read and/or write stop pointers can be used for flexible segmenting of a single memory.

In system AP2, the write address advances after 255 repeated signal vectors even if they remain unchanged. In an alternative embodiment, the write address does not change until the signal vector changes. In this case, a repetition count overflow indicator can be employed. Alternatively, a maximum count of 255 can simply indicate 255 or more repetitions.

The present invention has applicability to integrated circuit design and testing. Other modifications to and variations upon the disclosed embodiments are provided by the present invention, the scope of which is defined by the following claims.

What is claimed is:

1. An integrated circuit having a normal-operation mode of operation, a test-drive mode of operation, and a test-readout mode of operation, said integrated circuit comprising: drive-signal means for receiving drive-signal vectors;

captured-signal means for providing captured-signal vectors during said normal-operation mode and during said test-drive mode, said captured-signal vectors being functionally related to said drive-signal vectors during said test-drive mode;

test-port means for interfacing with a circuit tester during said test-readout mode; and queue means for storing contents, said contents including selected ones of said captured-signal vectors, said queue means having plural queue locations for storing respective ones of said captured-signal vectors, said queue means being coupled to said captured-signal means for receiving said captured-signal vectors during said normal-operation mode and said test-drive mode, said queue means being coupled to said test-port means for providing at least some of said contents thereto via said test-port means during said test-readout mode.

2. An integrated circuit as recited in claim 1 wherein said integrated circuit has a test-setup mode during which said test-port means is coupled to said queue means so that said drive-signal vectors can be stored therein, said queue means providing said drive-signal vectors to said drive-signal means during said test-drive mode.

3. An integrated circuit as recited in claim 2 wherein said queue means overwrites at least some of said drive-signal vectors with at least some of said captured-signal vectors during said test-drive mode.

4. An integrated circuit as recited in claim 1 further comprising error-detection logic, said error-detection logic being coupled to said queue means for disabling the storage of said captured-signal vectors therein during said normal-operation mode in response to an error detection.

5. An integrated circuit as recited in claim 1 further comprising compression means, said captured-signal means provides said captured-signal vectors sequentially, said compression means at least sometimes causing a captured-signal vector to overwrite its immediate predecessor in said queue when it is the same as its immediate predecessor.

6. An integrated circuit as recited in claim 5 further comprising mask means, each of said captured-signal vectors having plural dimensions, each of said dimensions corresponding to a signal of said integrated circuit, said mask means selecting a subset of said dimensions along which a captured-signal vector can differ from its immediate predecessor and yet overwrite its immediate predecessor in said queue.

7. An integrated circuit method comprising the steps of:

applying drive-signal vectors to drive-signal nodes of said integrated circuit and storing captured-test-signal vectors in a signal-vector queue of said integrated circuit;

reading out said captured-test-signal vectors from said queue so that information representing said captured-test-signal vectors is made available at a test port of said integrated circuit;

storing captured-normal-signal vectors in said queue; and reading out said captured-normal-signal vectors from said queue so that information representing said captured-normal-signal vectors is made available at said test port.

8. A method as recited in claim 7 further comprising a step of, before applying said drive-signal vectors, writing said drive-signal vectors to said queue.

9. A method as recited in claim 8 wherein at least some of said drive-signal vectors are overwritten by at least some of said test-drive vectors during said applying step.

10. A method as recited in claim 7 wherein during said applying and storing steps a captured-signal vector stored in said queue is overwritten by its immediate successor according to a predetermined compression criterion.

11. A method of analyzing the operation of an integrated circuit, said method comprising the steps of:

storing captured-normal-signal vectors in a queue during a normal mode of operation without external test equipment connected to or test software executing in said integrated circuit; and reading out from said queue said captured-normal-signal vectors with said external test equipment connected or with said test software executing so as to provide information regarding said captured-normal-signal vectors to said external test equipment or said test software.

12. A method as recited in claim 11 further comprising the steps of:

applying drive vectors to drive nodes of said integrated circuit and capturing resulting captured-test-signal vectors in said queue without external equipment connected to or test software executing on said integrated circuit; and reading out from said queue said captured-test-signal vectors with said external test equipment connected or with said test software executing so as to provide information regarding said captured-test-signal vectors to said external test equipment or to said test software.

13. A method as recited in claim 12 further comprising the step of, before said applying step, storing said drive-signal vectors in said queue while said external test equipment is connected or while said test-software is executing to said integrated circuit.

14. A method as recited in claim 13 wherein, during said applying step, some of said drive-signal vectors are overwritten by some of said captured-test-signal vectors in said queue.

* * * * *